(12) United States Patent
Adachi et al.

(10) Patent No.: US 11,245,237 B2
(45) Date of Patent: Feb. 8, 2022

(54) METHOD OF MANUFACTURING FLEXIBLE PRINTED INTERCONNECT BOARD

(71) Applicants: SUMITOMO ELECTRIC PRINTED CIRCUITS, INC., Shiga (JP); SUMITOMO ELECTRIC INDUSTRIES, LTD., Osaka (JP)

(72) Inventors: Yoshiro Adachi, Shiga (JP); Yoshifumi Uchita, Shiga (JP); Manabu Sudou, Shiga (JP); Yoshio Oka, Osaka (JP)

(73) Assignees: SUMITOMO ELECTRIC PRINTED CIRCUITS, INC., Shiga (JP); SUMITOMO ELECTRIC INDUSTRIES. LTD., Osaka (JP)

( * ) Notice: Subject to any disclaimer, the term of this patent is extended or adjusted under 35 U.S.C. 154(b) by 131 days.

(21) Appl. No.: 16/634,640

(22) PCT Filed: Jul. 26, 2018

(86) PCT No.: PCT/JP2018/028088
§ 371 (c)(1),
(2) Date: Jan. 28, 2020

(87) PCT Pub. No.: WO2019/035334
PCT Pub. Date: Feb. 21, 2019

(65) Prior Publication Data
US 2021/0044067 A1 Feb. 11, 2021

(30) Foreign Application Priority Data
Aug. 14, 2017 (JP) .............................. JP2017-156503

(51) Int. Cl.
*H01R 43/00* (2006.01)
*H01R 43/02* (2006.01)
(Continued)

(52) U.S. Cl.
CPC ......... *H01R 43/0263* (2013.01); *H01R 12/57* (2013.01); *H01R 43/205* (2013.01);
(Continued)

(58) Field of Classification Search
CPC .. H01R 43/0263; H01R 43/205; H01R 12/57; H05K 3/005; H05K 3/34
(Continued)

(56) References Cited

U.S. PATENT DOCUMENTS

| | | |
|---|---|---|
| 8,128,429 B2 | 3/2012 | Suzuki |
| 2002/0029904 A1 | 3/2002 | Matuschik |
| 2010/0041252 A1* | 2/2010 | Mizukami .......... H01R 13/6587 439/65 |

FOREIGN PATENT DOCUMENTS

| | | |
|---|---|---|
| JP | H05-082191 | 4/1993 |
| JP | H08-255642 | 10/1996 |

(Continued)

*Primary Examiner* — Peter Dungba Vo
*Assistant Examiner* — Azm A Parvez
(74) *Attorney, Agent, or Firm* — IPUSA, PLLC

(57) ABSTRACT

According to one aspect of the present invention, a method of manufacturing a flexible printed interconnect board, including an insulating base film; a conductive pattern that is layered on one surface side of the base film; and a plurality of connection terminals that are fixed to a terminal connection area on one edge side of the conductive pattern, includes: fixing the plurality of connection terminals in parallel to a component fixing jig; and mounting the plurality of fixed connection terminals together with the component fixing jig.

2 Claims, 4 Drawing Sheets

(51) Int. Cl.
  *H01R 12/57* (2011.01)
  *H01R 43/20* (2006.01)
  *H05K 3/00* (2006.01)
  *H05K 3/34* (2006.01)

(52) U.S. Cl.
  CPC ............... *H05K 3/005* (2013.01); *H05K 3/34* (2013.01); *H05K 2203/0108* (2013.01); *H05K 2203/0165* (2013.01)

(58) Field of Classification Search
  USPC .................. 29/844, 842, 829, 825, 592.1
  See application file for complete search history.

(56) References Cited

FOREIGN PATENT DOCUMENTS

| | | |
|---|---|---|
| JP | H11-330663 | 11/1999 |
| JP | 2001-313457 | 11/2001 |
| JP | 2010-044977 | 2/2010 |
| JP | 2015-233125 | 12/2015 |
| JP | 2015233125 A * | 12/2015 |
| WO | 2010/004439 | 1/2010 |

\* cited by examiner

US 11,245,237 B2

METHOD OF MANUFACTURING FLEXIBLE PRINTED INTERCONNECT BOARD

TECHNICAL FIELD

The present invention relates to a method of manufacturing a flexible printed interconnect board.

BACKGROUND

A flexible printed interconnect board includes a plurality of connection terminals that are connected to a conductive pattern an electronic device (see International Publication Pamphlet No. WO 2010/004439). The plurality of connection terminals may be attached, for example, by solder, one by one to a connection area provided on the surface of the flexible printed interconnect board.

PRIOR ART DOCUMENT

Patent Document

[Patent Document 1] International Publication Pamphlet No. WO 2010/004439

SUMMARY OF THE INVENTION

According to one aspect of the present invention, a method of manufacturing a flexible printed interconnect board, including an insulating base film; a conductive pattern that is layered on one surface side of the base film; and a plurality of connection terminals that are fixed to a terminal connection area on one edge side of the conductive pattern, includes: fixing the plurality of connection terminals in parallel to a component fixing jig; and mounting the plurality of fixed connection terminals together with the component fixing jig.

EMBODIMENT FOR CARRYING OUT THE INVENTION

Figure 1:
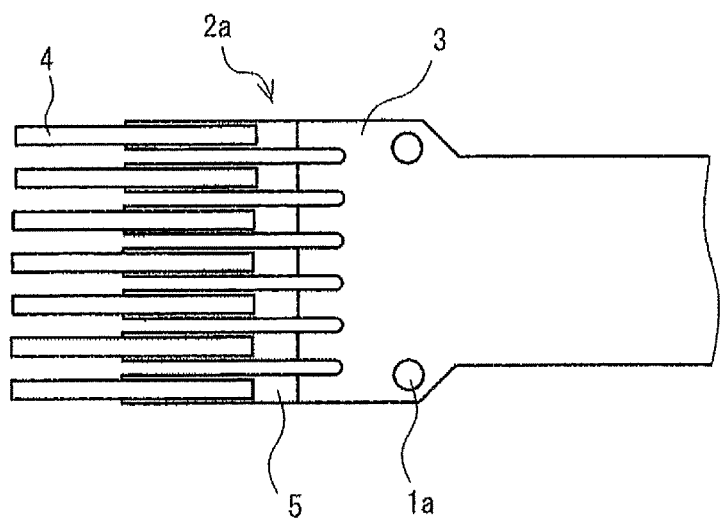
FIG. 1 is a schematic top view of a flexible printed interconnect board.

Problem to be Solved by the Present Disclosure

In recent years, various flexible printed interconnect boards are used in the field of electronic devices due to needs for smaller and lighter electronic devices. As such a flexible printed interconnect board, a flexible printed interconnect board is generally used that includes a base film to be a base and a conductive pattern formed by copper foil or the like layered on the surface of the base film.

Generally, connection terminals have a vertically long shape and mounted at a narrow pitch. Therefore, because a constant pitch between the connection terminals cannot be obtained due to a slight positional deviation at the time of mounting, mounting with high accuracy is difficult. In addition, because the connection terminals are mounted one by one, productivity is low.

Accordingly, the present disclosure has an object to provide a method of manufacturing a flexible printed interconnect board capable of mounting connection terminals with high accuracy and having high productivity.

Effect of the Present Disclosure

By using a method of manufacturing a flexible printed interconnect board, it is possible to mount connection terminals with high accuracy and high productivity.

DESCRIPTION OF EMBODIMENT OF THE PRESENT INVENTION (1) According to one aspect of the present invention, a method of manufacturing a flexible printed interconnect board, including an insulating base film; a conductive pattern that is layered on one surface side of the base film; and a plurality of connection terminals that are fixed to a terminal connection area on one edge side of the conductive pattern, includes: fixing the plurality of connection terminals in parallel to a component fixing jig; and mounting the plurality of fixed connection terminals together with the component fixing jig.

In the method of manufacturing the flexible printed interconnect board, the plurality of connection terminals are fixed in parallel to the component fixing jig and mounted at one time. Therefore, a directional deviation between the connection terminals does not easily occur, and the connection terminals can be mounted with high accuracy. Further, because the plurality of connection terminals are mounted at one time, by using the method of manufacturing the flexible printed interconnect board, productivity is enhanced.

(2) It is preferable that the base film has a plurality of holes for jig fixation, and, in the mounting, the plurality of holes for jig fixation are used to adjust a position of the component fixing jig. By using the holes for jig fixation of the base film to adjust the position of the component fixing jig, a relative position between the flexible printed interconnect board and the connection terminals fixed to the component fixing jig can be defined. Therefore, in the step of mounting the connection terminals, because a directional deviation of the connection terminals with respect to the base film does not easily occur, the connection terminals can be mounted with higher accuracy.

(3) It is preferable to include before the fixing, forming comb tooth portions on the one edge side of the conductive pattern wherein in the forming, a die for forming the comb tooth portions is used to form the plurality of holes for jig fixation. The plurality of connection terminals are mounted on the comb tooth portions together with the component fixing jig. By performing the formation of the comb tooth portions and the formation of the holes for jig fixation with a same die, it is possible to maintain, at any time, a constant relative relationship between the direction of the comb tooth portions and the direction of the plurality of holes for jig fixation. Therefore, because a deviation does not easily occur between the direction of the comb tooth portions and the direction of the plurality of holes for jig fixation, it is possible to reduce a mounting error of the connection terminals due to the directional deviation. Here, the "direction of the comb tooth portions" is the longitudinal direction of the comb tooth portions. Also, the "direction of the plurality of holes for jig fixation" is the direction of the straight line connecting the two holes for jig fixation in plan view (in a case where three or more holes for jig fixation are present, the direction of a straight line connecting any two holes for jig fixation in plan view).

Details of Embodiment of the Present Invention

In the following, an embodiment of a method of manufacturing a flexible printed interconnect board according to the present invention will be described in detail with reference to the drawings.

<Flexible Printed Interconnect Board>

First, a printed interconnect board that is manufactured by a method of manufacturing a flexible printed interconnect board according to one aspect of the present invention will be described with reference to FIG. 1 and FIG. 2. A flexible printed interconnect board illustrated in FIG. 1 and FIG. 2 includes an insulating base film 1, a conductive pattern 2 that is layered on one surface side of the base film 1, and a cover layer 3 that is layered on one surface of the base film 1 or the conductive pattern 2. Also, the flexible printed interconnect board has a terminal connection area 2a on one edge of the conductive pattern 2 and includes a plurality of connection terminals 4 that are fixed to the terminal connection area 2a.

<Base Film>

The base film 1 is a member that supports the conductive pattern 2 and is a structural material that guarantees the strength of the flexible printed interconnect board.

For example, as the main component of the base film 1, it is possible to use a liquid crystal polymer such as polyimide or liquid crystal polyester, a soft material such as polyethylene terephthalate, polyethylene naphthalate, polyphenylene ether, or fluorine resin, a hard material such as a paper phenol, a paper epoxy, a glass composite, a glass epoxy, a glass substrate, or a rigid flexible material in which a soft material and a hard material are combined. Among them, polyimide excellent in heat resistance is preferable. Note that the base film 1 may be made porous or may include a filler, an additive, or the like. Here, the "main component" means the component of which the content is the highest, and means the component of which the content is greater than or equal to 50% by mass.

The thickness of the base film 1 is not particularly limited, but the lower limit of the average thickness of the base film 1 is preferably 5 µm and is more preferably 12 µm. Also, the upper limit of the average thickness of the base film 1 is preferably 500 µm and is more preferably 200 µm. If the average thickness of the base film 1 is less than the above lower limit, the strength of the base film 1 may be insufficient. If the average thickness of the base film 1 exceeds the above upper limit, the flexibility of the flexible printed interconnect board may be insufficient.

The base film 1 has a pair of holes 1a for jig fixation. The holes 1a for jig fixation penetrate the cover layer 3. Also, in a case of overlapping with the conductive pattern 2 in plan view, the holes 1a for jig fixation penetrate the conductive pattern 2. The plan view shape of the holes 1a for jig fixation is not particularly limited, but may be, for example, a polygonal shape and is preferably a circular shape as illustrated in FIG. 1. When the plan view shape of the holes 1a for jig fixation is a circular shape, they can be easily inserted at the time of being used to adjust the position of a component fixing jig 7, which will be described later, and the strength of the base film 1 can be prevented from being lowered.

The holes 1a for jig fixation are provided at positions that do not affect a circuit pattern configured in the flexible printed interconnect board, but is preferably provided in or near the terminal connection area 2a. When the holes 1a for jig fixation are provided in or near the terminal connection area 2a, the holes 1a for jig fixation are relatively close to the connection terminals 4. Therefore, using the holes 1a for jig fixation, it is possible to easily adjust the position of the component fixing jig 7.

Also, the pair of holes 1a for jig fixation are preferably located away from each other in the width direction of the base film 1. In particular, the pair of holes 1a for jig fixation are preferably located at both ends of the base film 1 in the width direction. By providing the pair of holes 1a for jig fixation away from each other in the width direction, the positional adjustment accuracy of the component fixing jig 7 using the holes 1a for jig fixation can be enhanced.

The lower limit of the distance between the centers of the pair of holes 1a for jig fixation is preferably 1 mm and is more preferably 2 mm. If the distance between the centers of the pair of holes 1a for jig fixation is less than the above lower limit, the effect of enhancing the positional adjustment accuracy may be insufficient. The upper limit of the distance between the centers of the pair of holes 1a for jig fixation is not particularly limited but is determined by the width of the base film 1.

The lower limit of the diameter of the holes 1a for jig fixation (the diagonal length in a case where the holes 1a for jig fixation are polygonal) in plan view is preferably 0.5 mm and is more preferably 1 mm. The upper limit of the diameter of the holes 1a for jig fixation is preferably 5 mm and is more preferably 4 mm. If the diameter of the holes 1a for jig fixation is less than the above lower limit, because columnar portions 7d of the component fixing jig 7 that fit in the holes 1a for jig fixation used for positional adjustment become too thin, the component fixing jig 7 may easily be broken. When the diameter of the holes 1a for jig fixation exceeds the above upper limit, the strength of the base film 1 may decrease.

The lower limit of the distance between the holes 1a for jig fixation and one edge of the conductive pattern 2 (the distance between the centers of the holes 1a for jig fixation and one edge of the conductive pattern 2) is preferably 4 mm and is more is preferably 5 mm. The upper limit of the distance between the holes 1a for jig fixation and one edge of the conductive pattern 2 is preferably 50 mm and is more preferably 40 mm. If the distance between the holes 1a for jig fixation and one edge of the conductive pattern 2 is less than the above lower limit, the holes 1a for jig fixation may interfere with the connection terminals 4. If the distance between the holes 1a for jig fixation and one edge of the conductive pattern 2 exceeds the above upper limit, the component fixing jig 7 using the holes 1a for jig fixation becomes excessively large and may not be easily handled.

<Conduction Pattern>

The conductive pattern 2 constitutes a structure such as an electrical wiring structure, a ground, or a shield.

The material that forms the conductive pattern 2 is not particularly limited as long as it is a material having electrical conductivity. For example, a metal such as copper, aluminum, or nickel is used, and generally, copper, which is a relatively inexpensive and having a high electrical conductivity, is used as the material that forms the conductive pattern 2. Also, the surface of the conductive pattern 2 may be plated.

The lower limit of the average thickness of the conductive pattern 2 is preferably 2 μm and is more preferably 5 μm. The upper limit of the average thickness of the conductive pattern 2 is preferably 100 μm and is more preferably 70 μm. If the average thickness of the conductive pattern 2 is less than the above lower limit, the conductivity of the conductive pattern 2 may be insufficient. If the average thickness of the conductive pattern 2 exceeds the above upper limit, the flexible printed interconnect board may be unnecessarily thick.

The flexible printed interconnect board has a terminal connection area 2a on one edge side of the conductive pattern 2. The terminal connection area 2a is an area for connecting with another electronic device through the connection terminals 4, which will be described later below. On the terminal connection area 2a, a cover layer 3, which will be described later below, is removed.

Figure 2:
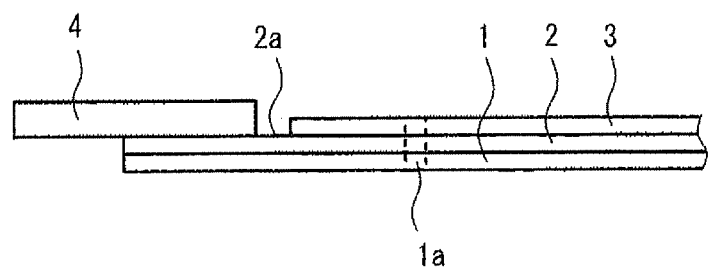
FIG. 2 is a schematic side view of the flexible printed interconnect board of FIG. 1.

As illustrated in FIG. 1, the conductive pattern 2 is branched at one edge side to have a comb shape. One connection terminal 4 is secured to each of the comb teeth, i.e., to each of the respective comb tooth portions 5.

The size of the comb tooth portions 5 is appropriately determined depending on the size of the connection terminals 4, but for example, the average width can be greater than or equal to 0.5 mm and less than or equal to 3 mm, and the average length can be greater than or equal to 3 mm and less than or equal to 50 mm. Also, the number of comb tooth portions 5 is determined in accordance with the number of connection terminals 4. Usually, the width of the base film 1 including the terminal connection area 2a is constant, but depending on the number of connection terminals 4, there may be a case of not fitting within the width of the base film 1 excluding the terminal connection area 2a. In such a case, for example, as illustrated in FIG. 1, the number of comb tooth portions 5 can be secured by widening the base film 1 on one edge side.

<Cover Layer>

The cover layer 3 protects the conductive pattern 2 from external forces, moisture, and the like. The cover layer 3 includes a cover film and an adhesive layer. The cover layer 3 is formed by laminating the cover film through the adhesive layer on the surface of the conductive pattern 2, opposite to the base film 1.

(Cover Film)

Although the material of the cover film is not particularly limited, for example, a resin similar to that constituting the base film 1 may be used as the material of the cover film.

The lower limit of the average thickness of the cover film is preferably 5 μm and is more preferably 10 μm. The upper limit of the average thickness of the cover film is preferably 50 μm and is more preferably 30 μm. If the average thickness of the cover film is less than the above lower limit, the insulation property may be insufficient. If the average thickness of the cover film exceeds the above upper limit, the flexibility of the flexible printed interconnect board may be impaired.

(Adhesive Layer)

The adhesive layer fixes the cover film to the conductive pattern 2 and the base film 1. The material of the adhesive layer is not particularly limited as long as it can fix the cover film to the conductive pattern 2 and the base film 1. For example, the material of the adhesive layer is preferably a material that is excellent in flexibility and heat resistance, such as polyimide, polyamide, epoxy, butyral, acrylic, or the like. Also, in terms of heat resistance, a thermosetting resin is preferable.

The average thickness of the adhesive layer of the cover layer 3 is not particularly limited, but the lower limit of the average thickness of the adhesive layer is preferably, for example, 5 μm and is more preferably 10 μm. The upper limit of the average thickness of the adhesive layer is, for example, preferably 100 μm and is more preferably 80 μm. If the average thickness of the adhesive layer is less than the above lower limit, adhesive properties may be insufficient. If the average thickness of the bonding layer exceeds the above upper limit, the flexibility of the flexible printed interconnect board may be impaired.

<Connection Terminals>

The connection terminals 4 are components for connecting the flexible printed interconnect board to another electronic device or the like.

Although the material of the connection terminals 4 is not particularly limited as long as the connection terminals 4 are electrically conductive, for example, the connection terminals 4 can be made of metal. Examples of the metal include soft copper, brass, phosphor bronze, and the like. Also, the surfaces of the connection terminals 4 are preferably plated to prevent oxidation. Plating can be Sn plating, Ni plating, Au plating, or the like. Among these, Ni plating, which is low in cost and excellent in corrosion resistance, is preferable.

The shape of the connection terminals 4 is determined in accordance with the shape of terminals of an electronic device or the like to be connected, but is generally a lengthwise shape (the shape that is long in the length direction of the base film 1). For example, the shape of the connection terminals 4 can be a plate shape or a molded three-dimensional shape in which the average width is greater than or equal to 0.5 mm and less than or equal to 3 mm, the average length is greater than or equal to 3 mm and less than or equal to 50 mm, and the average height is greater than or equal to 0.1 mm and less than or equal to 3 mm.

Parts of the connection terminals 4 protrude from the terminal connection area 2a. The average length of the protruding parts depends on the shape of terminals of an electronic device to be connected or the like, but is preferably greater than or equal to 20% and less than or equal to 80% of the average length of the connection terminals 4. If the average length of the protruding parts is less than the above lower limit, the adhesive strength to another electronic device may be insufficient. If the average length of the protruding parts exceed the above upper limit, the adhesive strength to the flexible printed interconnect board may be insufficient.

<Method of Manufacturing Flexible Printed Interconnect Board>

Figure 3:
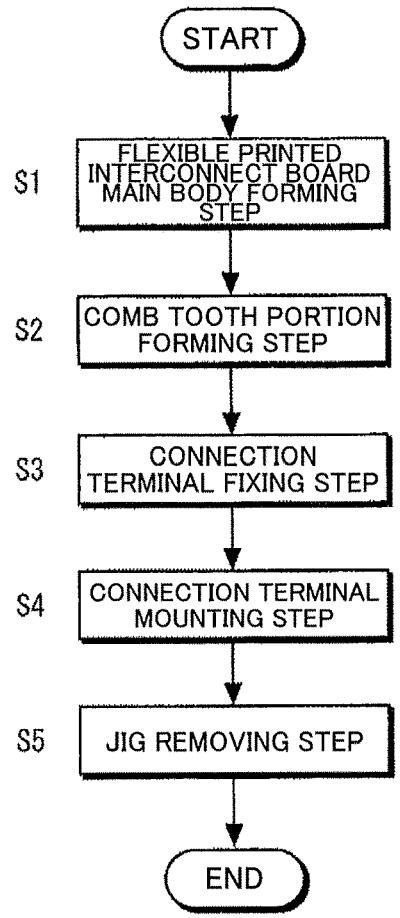
FIG. 3 is a schematic flowchart illustrating a method of manufacturing a flexible printed interconnect board according to one aspect of the present invention.

As illustrated in FIG. 3, a method of manufacturing the flexible printed interconnect board includes a flexible printed interconnect board main body forming step S1, a comb tooth portion forming step S2, a connection terminal fixing step S3, a connection terminal mounting step S4, and a jig removing step S5.

<Flexible Printed Interconnect Board Main Body Forming Step>

Figure 4:
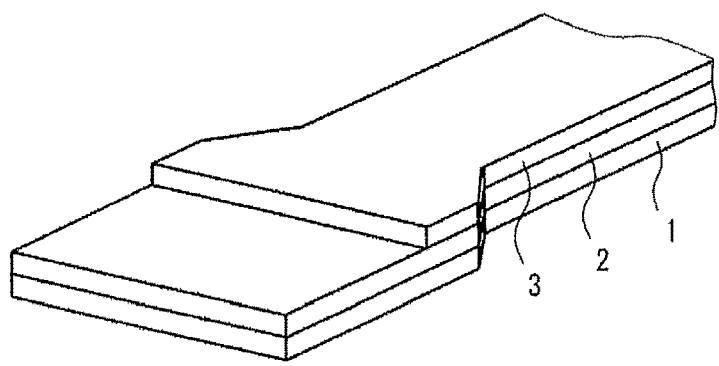
FIG. 4 is a schematic perspective view of a flexible printed interconnect board main body.

In the flexible printed interconnect board main body forming step S1, a flexible printed interconnect board main body is formed including an insulating base film 1, a conductive pattern 2 that is layered on one surface side of the base film 1, and a cover layer 3 that is layered on one surface of the base film 1 or the conductive pattern 2 (see FIG. 4). Specific procedures are as follows.

First, a conductive layer is formed on one surface of the base film 1.

The conductor layer can be formed, for example, by using an adhesive agent to bond a foil-like conductor or by a known deposition technique. The conductor is the same material as the material constituting the conductive pattern 2, and the material of the conductor is, for example, copper, silver, gold, nickel, or the like. The adhesive agent is not particularly limited as long as it can bond the conductor to the base film 1, and various known adhesives can be used as the adhesive agent. Examples of the deposition technique include vapor deposition, plating, and the like. The conductive layer is preferably formed by using a polyimide adhesive agent to bond copper foil to the base film 1.

Then, the conductive layer is patterned to form the conductive pattern 2.

Patterning of the conductive layer can be performed by a known method, such as photoetching. Photo etching is performed by forming a resist film having a predetermined pattern on one surface of the conductive layer, then processing the conductive layer exposed from the resist film with an etching solution, and removing the resist film.

Finally, excluding the terminal connection area 2a of the conductive pattern 2, the cover layer 3 is layered to cover the conductive pattern 2. Specifically, an adhesive layer is layered on the surface of the base film 1 on which the conductive pattern 2 is formed, and a cover film is layered on the adhesive layer.

Alternatively, an adhesive layer may be layered in advance on a cover film, and the surface on which the adhesive layer is laminated of the cover film is bonded to face the conductive pattern 2.

The adhesion of the cover film using an adhesive agent can usually be performed by thermal pressure bonding. The temperature and pressure at the time of thermal pressure bonding may be determined depending on a type, a composition, and the like of an adhesive agent to be used.

<Comb Tooth Portion Forming Step>

In the comb tooth portion forming step S2, comb tooth portions 5 are formed at one edge side of the conductive pattern 2 of the flexible printed interconnect board main body formed in the flexible printed interconnect board main body forming step S1.

Figure 5:
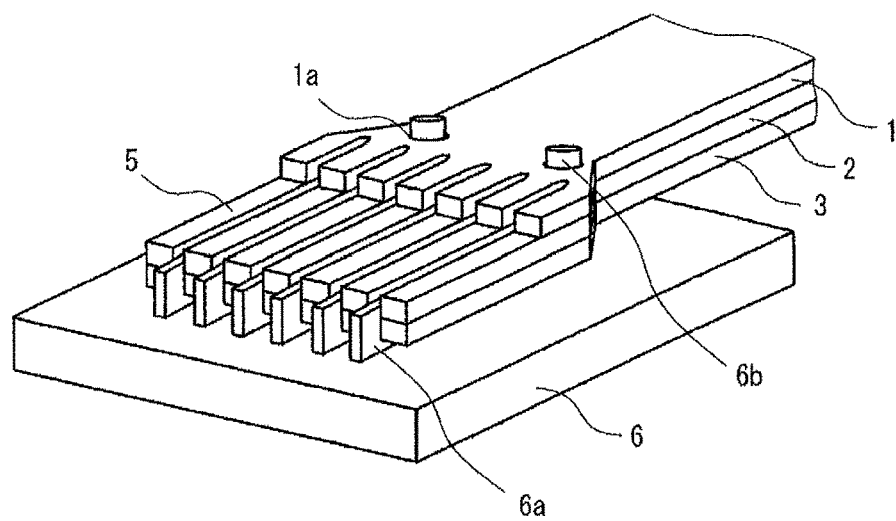
FIG. 5 is a schematic perspective view illustrating a state in which comb tooth portions and holes for jig fixation are formed by a comb tooth portion forming die in a comb tooth portion forming step.

As illustrated in FIG. 5, the comb tooth portions 5 can be formed by a punching process using a comb tooth portion forming die 6. The comb tooth portion forming die 6 is a die that punches out portions corresponding to the voids between the comb tooth portions 5. Also, the comb tooth portion forming die 6 has a cutting die 6a corresponding to the voids between the comb tooth portions 5 and a cutting die 6b corresponding to the holes 1a for jig fixation. Therefore, the holes 1a for jig fixation can be formed by using the die that forms the comb tooth portions 5. By performing the formation of the comb tooth portions 5 and the formation of the holes 1a for jig fixation with a same die, it is possible to maintain, at any time, a constant relative relationship between the direction of the comb tooth portions 5 and the direction of the pair of holes 1a for jig fixation. Therefore, because a deviation does not easily occur between the direction of the comb tooth portions 5 and the direction of the pair of holes 1a for jig fixation, it is possible to reduce a mounting error of the connection terminals 4 due to the directional deviation.

The material of the comb tooth portion forming die 6 is not particularly limited, and can be, for example, a typical carbon tool steel (SK material). Also, the shape of the comb tooth portion forming die 6 is determined as appropriate to be a shape of being able to process the comb tooth portions 5 and the holes 1a for jig fixation.

<Connection Terminal Fixing Step>

In the connection terminal fixing step S3, a plurality of connection terminals 4 are fixed in parallel to a component fixing jig 7.

Figure 6:
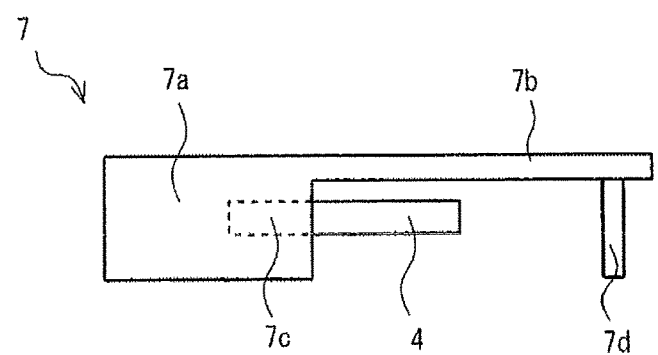
FIG. 6 is a schematic side view illustrating a state in which connection terminals are fixed to a component fixing jig in a connection terminal fixing step.
Figure 7:
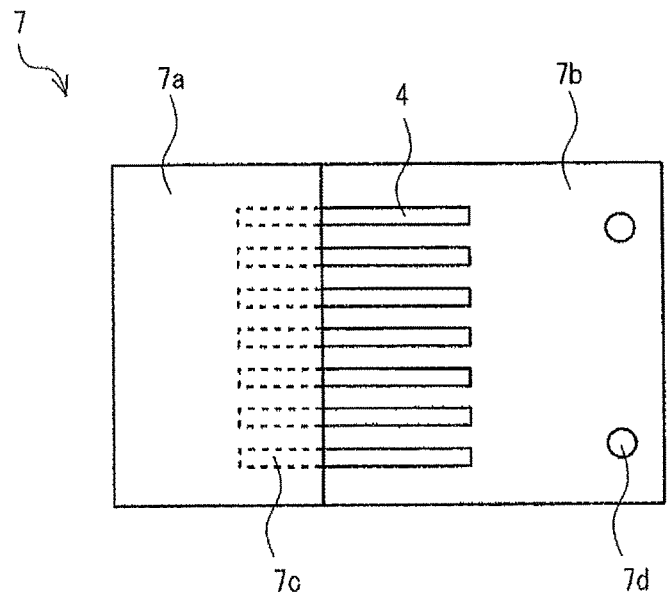
FIG. 7 is a schematic back view of a state in which the connection terminals are fixed to the component fixing jig of FIG. 6.

As illustrated in FIG. 6 and FIG. 7, the component fixing jig 7 used in the connection terminal fixing step S3 includes a rectangular parallelepiped jig main body 7a, a plate-shaped brim portion 7b extending from the upper portion at one surface of the jig main body 7a to the outside, a plurality of slots 7c that are provided on a surface of the jig main body 7a and that can fix the connection terminals 4, and a pair of columnar portions 7d that are provided on the bottom surface of the brim portion 7b, for example.

The material of the component fixing jig 7 is not particularly limited, and can be, for example, a typical carbon tool steel (SK material).

The number of slots 7c of the component fixing jig 7 is the same as the number of connection terminals 4 of the flexible printed interconnect board to be manufactured. The interval between adjacent slots 7c is the same as the interval between adjacent connection terminals 4. The depth of the slots 7c of the component fixing jig 7 is determined in accordance with the average length of the protruding portions after mounting the connection terminals 4.

The pair of columnar portions 7d of the component fixing jig 7 can be fitted in the pair of holes 1a for jig fixation.

In other words, by fixing the connection terminals 4 to all of the plurality of slots 7c of the component fixing jig 7 and fitting the pair of columnar portions 7d into the pair of holes 1a for jig fixation, the plurality of fixed connection terminals 4 are placed at mounting positions of the respective comb tooth portions 5.

<Connection Terminal Mounting Step>

In the connection terminal mounting step S4, the plurality of connection terminals 4 fixed in the connection terminal fixing step S3 are mounted on the comb tooth portions 5 together with the component fixing jig 7. Specific procedures are as follows.

First, solder is provided on the terminal connection area 2a of the conductive pattern 2.

Figure 8:
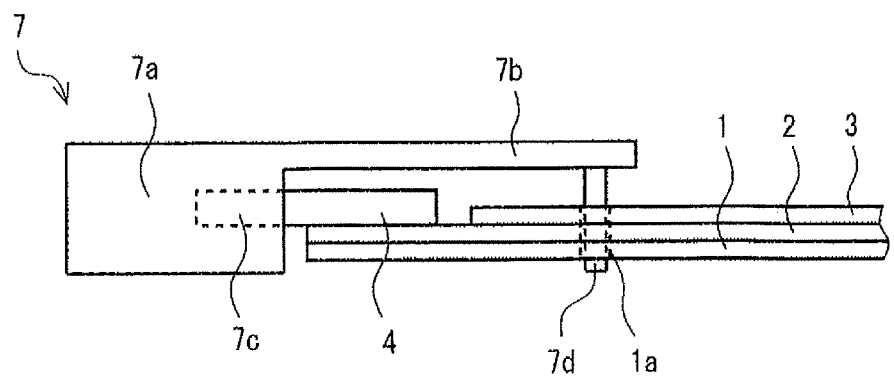
FIG. 8 is a schematic side view illustrating a state in which the plurality of connection terminals are mounted at mounting position of the respective comb tooth portions using the component fixing jig in a connection terminal mounting step.

Next, as illustrated in FIG. 8, by fitting the pair of columnar portions 7d of the component fixing jig 7, to which the plurality of connection terminals 4 are fixed, into the pair of holes 1a for jig fixation, the plurality of connection terminals 4 are placed at mounting positions of the respective comb tooth portions 5. By using the pair of holes 1a for jig fixation to adjust the position of the component fixing jig 7, a relative position between the flexible printed interconnect board and the connection terminals 4 fixed to the component fixing jig 7 can be defined. Therefore, because a directional deviation of the connection terminals 4 with respect to the base film 1 does not easily occur, the connection terminals 4 can be mounted with higher accuracy.

Thereafter, the solder is melted by reflow, and the connection terminals 4 are soldered to the conductive pattern 2.

<Jig Removing Step>

In the jig removing step S5, the component fixing jig 7 is removed after the connection terminal mounting step S4.

By removing the component fixing jig 7, the connection terminals 4 are mounted and the flexible printed interconnect board is formed.

[Advantages]

In the method of manufacturing the flexible printed interconnect board, the plurality of connection terminals 4 are fixed in parallel to the component fixing jig 7 and mounted at one time. Therefore, by using the method of manufacturing the flexible printed interconnect board, because a directional deviation between the connection terminals 4 does not easily occur, the connection terminals 4 can be mounted with high accuracy. Further, because the plurality of connection terminals 4 are mounted at one time, by using the method of manufacturing the flexible printed interconnect board, productivity is enhanced.

OTHER EMBODIMENTS

It should be understood that the embodiment disclosed herein is exemplary in all respects and is not restrictive. The scope of the present invention is not limited to the construction of the embodiment described above, but is set forth by the claims, and is intended to include all modifications within the meaning and scope of the claims and equivalents.

In the above described embodiment, although a case has been described in which the method of manufacturing the flexible printed interconnect board includes the comb tooth portion forming step, the comb tooth portion forming step is not essential. The method of manufacturing a flexible printed interconnect board can also be used with respect to a flexible printed interconnect board without comb tooth portions, a flexible printed interconnect board having a square-shaped terminal connection area in plan view, for example.

In the above described embodiment, although a case has been described in which the method of manufacturing the flexible printed interconnect board includes the jig removing step, the jig removing step is not essential. For example, in a case in which the component fixing jig is directly used as a part of the flexible printed interconnect board, for example, as a housing of the connection terminals, the component fixing jig need not be removed, and the jig removing step can be omitted.

In the above described embodiment, although a case has been described in which the base film has the pair of holes for jig fixation, but the holes for jig fixation are not limited to one pair, i.e., two, and may be three or more.

In the above described embodiment, although a case has been described in which the base film has the pair of holes for jig fixation and the position of the component fixing jig is adjusted using the holes for jig fixation in the connection terminal mounting step, the positional adjustment of the component fixing jig is not limited to the method of using the holes for jig fixation, and may be performed visually, for example. In this case, the pair of holes for jig fixation of the base film may be omitted. Also, the component fixing jig may have a configuration not including a brim portion and columnar portions.

In the above described embodiment, although a case has been described in which, in the comb tooth portion forming step, the die that forms the comb tooth portions is used to form the holes for jig fixation, the comb tooth portions and the holes for jig fixation may be separately formed by using different dies. Even in a case in which the comb tooth portions and the holes for jig fixation are separately formed, by using the method of manufacturing the flexible printed interconnect board, the connection terminals can be mounted with high accuracy.

In the above described embodiment, although a case has been described in which the plurality of connection terminals are mounted collectively using the component fixing jig, when a plurality of connection terminals are mounted at one time, mounting may be performed in multiple times. By performing mounting in multiple times, because the number of connection terminals to be fixed at one time is reduced, the size of the component fixing jig can be reduced. In a case of performing mounting in multiple times, the upper limit of the number of times of mounting is preferably 4, is more preferably 3, and is further more preferably 2. If the number of times of mounting exceeds the above upper limit, the mounting accuracy may deteriorate or productivity may decrease.

The shape of the component fixing jig is not limited to the above described embodiment. For example, in the above described embodiment although a case has been described in which the connection terminals are fixed by the slots, the shape of fixed portions may be, for example, recessed portions provided on the lower surface side of the component fixing jig. Also, in the above described embodiment, although a case has been described in which the columnar portions are provided on the plate-shaped brim portion, the brim portion may be a strip shape provided on both ends of the component fixing jig, or the brim portion may be hollow. In the embodiment described above, although the brim portion is provided to extend from the upper portion of the jig main body, the brim portion can be provided to extend from the lower portion of the jig main body such that the columnar portions can be provided on the upper surface of the brim portion.

In the above described embodiment, although a case has been described in which the holes for jig fixation penetrate the flexible printed interconnect board, the holes for jig fixation do not need to penetrate. The holes for jig fixation may be, for example, holes penetrating only the base film, i.e., recessed portions on the back surface of the flexible printed interconnect board.

Figure 9:
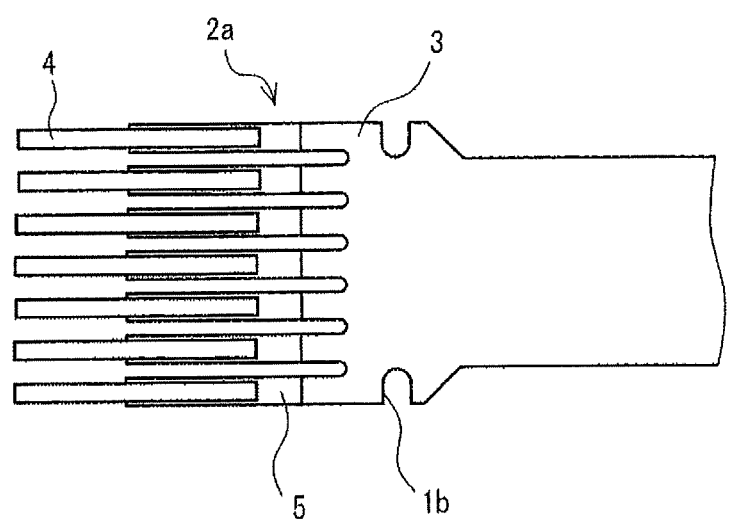
FIG. 9 is a schematic top view of a flexible printed interconnect board having holes for jig fixation different in shape from that in FIG. 1.

Also, the holes for jig fixation may be holes 1b for jig fixation partly connected to the outer edge of the flexible printed interconnect board as illustrated in FIG. 9, for example. That is, the holes 1b for jig fixation may have a groove shape in continuous with the outer edge of the flexible printed interconnect board. Examples of the groove shape include, but are not particularly limited to, a U-shaped groove as illustrated in FIG. 9, a rectangular shape in plan view, a trapezoidal shape in which the groove width gradually decreases toward the inside of the flexible printed interconnect board, a triangular shape, and the like.

The flexible printed interconnect board is not limited to the above described embodiment, and the method of manufacturing a flexible printed interconnect board can be used for a flexible printed interconnect board with a reinforced portion on the other surface of a base film, a flexible printed interconnect board without a cover layer, and the like.

DESCRIPTION OF THE REFERENCE NUMERALS

1 base film
1a and 1b holes for jig fixation 2 conductive pattern
2a terminal connection area
3 cover layer
4 connection terminal
5 comb tooth portion
6 comb tooth portion forming die
6a and 6b cutting dies
7 component fixing jig
7a jig main body
7b brim portion
7c slot
7d columnar portion
S1 flexible printed interconnect board main body forming step
S2 comb tooth portion forming step
S3 connection terminal fixing step
S4 connection terminal mounting step
S5 jig removing step

The invention claimed is:

1. A method of manufacturing a flexible printed interconnect board including an insulating base film; a conductive pattern that is layered on one surface side of the base film; and a plurality of connection terminals that are fixed to a terminal connection area on one edge side of the conductive pattern, the method comprising:
preparing the base film;
layering the conductive pattern on the base film;
using a die to form comb tooth portions on the one edge side of the conductive pattern and to form a plurality of holes for jig fixation in the base film;
after forming the comb tooth portions and the plurality of holes for jig fixation, fixing the plurality of connection terminals in parallel to a component fixing jig; and
mounting, to the terminal connection area, the plurality of fixed connection terminals together with the component fixing jig, wherein in the mounting, the plurality of holes for jig fixation are used to adjust a position of the component fixing jig; and
removing the component fixing jig.

2. The method of manufacturing the flexible printed interconnect board according to claim 1,
wherein the plurality of holes for jig fixation include a pair of holes for jig fixation in a width direction of the base film,
wherein the method includes, in the mounting, arranging, on the component fixing jig to which the plurality of connection terminals are fixed, the base film with the conductive pattern, where the comb tooth portions and the pair of holes for jig fixation are formed, to mount the plurality of connection terminals to the comb tooth portions,
wherein the die includes
a cutting die configured to form the comb tooth portions and
a cutting die corresponding to the pair of holes for jig fixation,
wherein the component fixing jig includes
a main body having a plurality of slots configured to fix, in a longitudinal direction, the plurality of connection terminals that are longitudinal,
a brim portion provided on an upper surface of the main body and extending in a direction in which the slots are opened, and
a pair of columnar portions that are provided on a bottom surface of the brim portion and corresponding to the pair of holes for jig fixation.

* * * * *